United States Patent
Narita et al.

(10) Patent No.: US 6,911,398 B2
(45) Date of Patent: Jun. 28, 2005

(54) METHOD OF SEQUENTIALLY PROCESSING A PLURALITY OF LOTS EACH INCLUDING SEMICONDUCTOR SUBSTRATES

(75) Inventors: Masaki Narita, Yokohama (JP); Katsuya Okumura, Tokyo (JP); Tokuhisa Ohiwa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/107,434

(22) Filed: Mar. 28, 2002

(65) Prior Publication Data

US 2002/0155727 A1 Oct. 24, 2002

(30) Foreign Application Priority Data

Mar. 29, 2001 (JP) ........................................ 2001-095306

(51) Int. Cl.[7] .......................................... H01L 21/302
(52) U.S. Cl. ...................................... 438/706; 438/712
(58) Field of Search ..................... 438/8, 9, 706–714, 438/974; 134/1.1, 5, 1.3; 21/88, 89

(56) References Cited

U.S. PATENT DOCUMENTS

| | | | | |
|---|---|---|---|---|
| 5,897,378 A | * | 4/1999 | Eriguchi | 438/707 |
| 6,168,672 B1 | * | 1/2001 | Nguyen | 134/18 |
| 6,214,751 B1 | * | 4/2001 | Lee | 438/800 |
| 6,280,790 B1 | * | 8/2001 | White et al. | 427/8 |
| 6,425,953 B1 | * | 7/2002 | Johnson | 134/1 |
| 2001/0041311 A1 | * | 11/2001 | Araki et al. | 430/325 |

FOREIGN PATENT DOCUMENTS

| JP | 10-149990 | 6/1998 |
|---|---|---|
| JP | 10-199817 | 7/1998 |
| JP | 13-351868 | 12/2001 |

* cited by examiner

*Primary Examiner*—Kin-Chan Chen
(74) *Attorney, Agent, or Firm*—Finnegan, Henderson, Farabow, Garrett & Dunner, L.L.P.

(57) ABSTRACT

A method of making a semiconductor device, comprises preparing a plurality of lots each including semiconductor substrates to be processed, the plurality of lots including at least first and second lots, processing the plurality of lots for every one lot, using a semiconductor manufacturing apparatus, judging whether or not the semiconductor manufacturing apparatus is subjected to cleaning before the second lot is processed, depending upon both a first processing type of the first lot to be processed and a second processing type of the second lot to be processed after the first lot, and processing the second lot without the cleaning in the case where the second lot does not require the cleaning.

9 Claims, 3 Drawing Sheets

METHOD OF SEQUENTIALLY PROCESSING
A PLURALITY OF LOTS EACH INCLUDING
SEMICONDUCTOR SUBSTRATES

CROSS-REFERENCE TO RELATED APPLICATIONS

This application is based upon and claims the benefit of priority from the prior Japanese Patent Application No. 2001-095306, filed Mar. 29, 2001, the entire contents of which are incorporated herein by reference.

BACKGROUND OF THE INVENTION

1. Field of the Invention

The present invention relates to a method of making a semiconductor device comprising a series of steps for processing a plurality of lots, each including semiconductor substrates to be processed, for every one lot by using the same semiconductor manufacturing apparatus.

2. Description of the Related Art

Reactive ion etching (RIE) apparatus is known to the art as one of semiconductor manufacturing apparatus utilizing plasma. In the RIE apparatus, a negative potential is applied to a wafer and a reactive gas (etching gas) is discharged by using a high frequency power to produce the plasma. The ions contained in the plasma are impinged on the wafer surface in a direction perpendicular to the wafer surface to etch the wafer physically and chemically.

Where a via hole is formed in an insulating film, a gas containing mainly a fluorocarbon is used as the etching gas. To be more specific, in order to prevent a metal wiring layer exposed to the bottom surface of the via hole from being etched, used in general is an etching gas capable of ensuring a selectivity ratio relative to the metal wiring layer, i.e., a gas containing $CHF_3$, $C_4F_8$, etc.

If the RIE processing is applied to an insulating film by using the etching gas noted above, the gas within the plasma is decomposed, with the result that a fluorocarbon, carbon, etc. are deposited on an inner wall of a vacuum chamber. In this case, the reaction product, produced during the RIE processing of the insulating film, is also deposited partly to the inner wall of the vacuum chamber.

These fluorocarbon, carbon and reaction product are deposited to the inner wall of the vacuum chamber, thereby forming a deposited film containing fluorocarbon, etc.

The thickness of the deposited film is gradually increased with progress of the processing. When the deposited film grows to reach a certain thickness, the deposited film is peeled from the inner wall of the vacuum chamber to give rise to unwanted generation of particles. In order to prevent such a problem, employed nowadays is the technique that the inner space of the vacuum chamber is allowed to communicate with the air atmosphere before the deposited film grows to reach a certain thickness, thereby carrying out wet cleaning of the inner wall of the vacuum chamber.

The RIE processing of the insulating film includes various patterns, and different gases are selected depending on the requirements of the patterns. For example, a gas different from that used in the RIE processing of the via hole is used in the RIE processing of a wiring groove in a damascene process.

The damascene process is a process that has come to be used in recent years. In the damascene process, a wiring groove is formed in the surface of an insulating film by the RIE process, followed by depositing a metal film for forming a wiring layer on the entire surface in a manner to bury the wiring groove therewith and subsequently removing the undesired metal film outside the wiring groove by CMP (Chemical Mechanical Polishing).

In the case of the damascene process, a high dimensional accuracy is required because the pattern of the wiring layer is determined by the pattern of the wiring groove. Therefore, since the RIE processing of the wiring groove differs from the RIE processing of the via hole, a gas is selected which has the reduced fluorocarbon and carbon when the gas is decomposed.

If a different gas is selected, formed naturally on the inner wall of the vacuum chamber is a deposited film having a different composition. Where RIE processes using different gases are performed within the same vacuum chamber to form a stacked structure of deposited films greatly differing from each other in composition, the deposited films are peeled off for a shorter time at the stage that the deposited films have smaller thicknesses because of, for example, the difference in the thermal expansion coefficient among the deposited films to give rise to the particle generation problem. What should be noted is that the growth of the deposited film to reach a certain thickness is not the sole cause of the peeling of the deposited film.

In order to avoid the problem of this type, the target process performed is limited nowadays in respect of each of a plurality of RIE apparatuses used in view of the composition of the gas used and quality of the deposited film.

Further, where the gases used in different process steps widely differ from each other in composition, an additional problem is generated that the gas released from the deposited film formed in the previous process step affects the succeeding process. Therefore, it is necessary to prepare a large number of RIE apparatus greater than the number of target process steps that are actually performed.

In order to overcome these various problems, it is necessary to remove the deposited film formed immediately before on the inner wall of the vacuum chamber with the plasma (plasma cleaning) when the processing is applied to the subsequent substrate lot Aj (j=i+1) by using the same RIE apparatus after completion of the processing applied to a certain substrate lot Ai (i=1 to 19), as shown in FIG. 3.

However, such a measure shown in FIG. 3 is not practical because a very long time is required if the plasma cleaning is performed every time the processing is applied to the subsequent substrate lots.

As described above, in order to overcome the various problems relating to the peeling of the deposited film, it is necessary to remove the deposited film formed immediately before on the inner wall of the vacuum chamber with the plasma when the subsequent processing is carried out after completion of the same processing. However, the measure is not practical because a very long time is required for removing the deposited film every time the subsequently processing is performed.

BRIEF SUMMARY OF THE INVENTION

A manufacturing method of a semiconductor device according to one embodiment of the present invention comprises preparing a plurality of lots each including semiconductor substrates to be processed, the plurality of lots including at least first and second lots; processing the plurality of lots for every one lot, using a semiconductor manufacturing apparatus; judging whether or not the semiconductor manufacturing apparatus is subjected to cleaning before the second lot is processed, depending upon both a first processing type of the first lot to be processed and a second processing type of the second lot to be processed after the first lot; and processing the second lot without the cleaning in the case where the second lot does not require the cleaning.

A manufacturing method of a semiconductor device according to another embodiment of the present invention comprises preparing a plurality of lots each including semiconductor substrates to be processed; processing the plurality of lots for every one lot, using semiconductor manufacturing apparatus; extracting at least one lot to be processed from a plurality of residual lots without cleaning the semiconductor manufacturing apparatus, the plurality of residual lots being processed after the first lot is processed; and processing the at least one lot after processing the first lot.

EMBODIMENTS

Embodiments of the present invention will now be described in detail with reference to the accompanying drawings.

Figure 1:
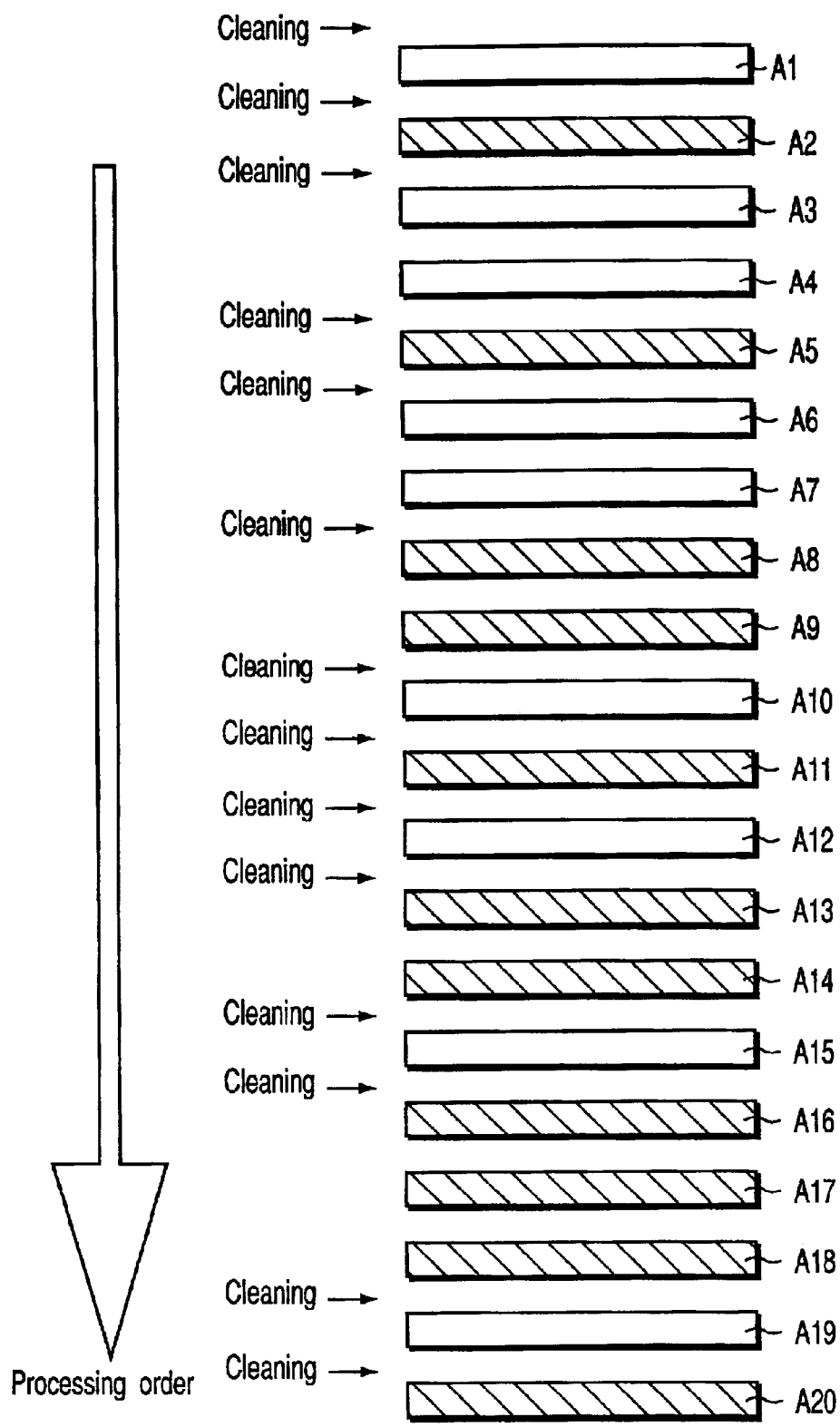
FIG. 1 schematically shows a method of processing a plurality of lots each including Si substrates to be processed by using an RIE apparatus according to a first embodiment of the present invention.

FIG. 1 schematically shows a method of processing a plurality of lots each including Si substrates to be processed by using an RIE apparatus according to a first embodiment of the present invention.

The marks A1, A3, A4, A6, A7, A10 A12, A15 and A19 shown in FIG. 1 denote an Si substrate lot including a plurality of Si substrates each of which is subjected to RIE processing for forming a wiring groove in an oxide film. The RIE processing is performed under the pressure of 40 mTorr, a high frequency power of 1,400W, etching gases and the flow rates of $CF_4/Ar/O_2$=80 SCCM/160 SCCM/20 SCCM, and the substrate temperature of 40° C., respectively.

On the other hand, the marks A2, A5, A8, A9, A11, A13, A14, A16, A17, A18 and A20 shown in FIG. 1 denote an Si substrate lot including a plurality of Si substrates each of which is subjected to the RIE processing for forming a contact hole having a high aspect ratio in an oxide film. The RIE processing is carried out under the pressure of 45 mTorr, a high frequency power of 1,500W, the etching gases and the flow rates of $C_4F_8/CO/Ar/O_2$=13 SCCM/46 SCCM/220 SCCM/4 SCCM, and the substrate temperature of 40° C., respectively.

The RIE processing applied to the oxide film can be roughly classified into two types. The first type includes, for example, the RIE processing for contacts, the RIE processing for SACs (Self Align Contacts), and the RIE processing for Via holes (via holes leading to the metal wiring layers).

In the case of the first type RIE processing, it is necessary to ensure a selectivity ratio to increase sufficiently the etching rate of the oxide film rather than the etching rate of the photoresist pattern and the etching rate of the exposed underlying layer. Therefore, a gas for positively producing the deposited film is used as an etching gas. As a result, the deposited film formed of the decomposed product of the gas is thickly deposited on the inner wall of the vacuum chamber.

The second type includes the RIE processing for forming the wiring groove in the oxide film and the RIE processing for processing a mask for a metal film providing a wiring layer.

In the case of the second type RIE processing, it is necessary to transfer the size of the resist pattern onto the resist with a high fidelity because the size of the wiring layer is affected. Therefore, a gas for suppressing unwanted production of the deposited film is used as the etching gas.

In the case of the RIE processing applied to the oxide film, the Si substrate lot including a plurality of Si substrates each having a photoresist pattern formed on the oxide film is successively transferred into the RIE processing. In general, the RIE processing is successively applied in the order of the progress in the RIE steps in order to prevent a stop of the Si substrate lot. It is not taken into consideration what type of the RIE processing is applied to each Si substrate lot in the RIE apparatus.

Nowadays, if the second type RIE processing is carried out for the Si substrate lot which has finished the first type RIE processing, a gas is generated from the deposited film formed on the inner wall of the vacuum chamber by the first type RIE processing, with the result that the etching rate, the selectivity ratio, the processed shape, etc. are affected by the gas generated from the deposited film during the second type RIE processing.

Figure 3:
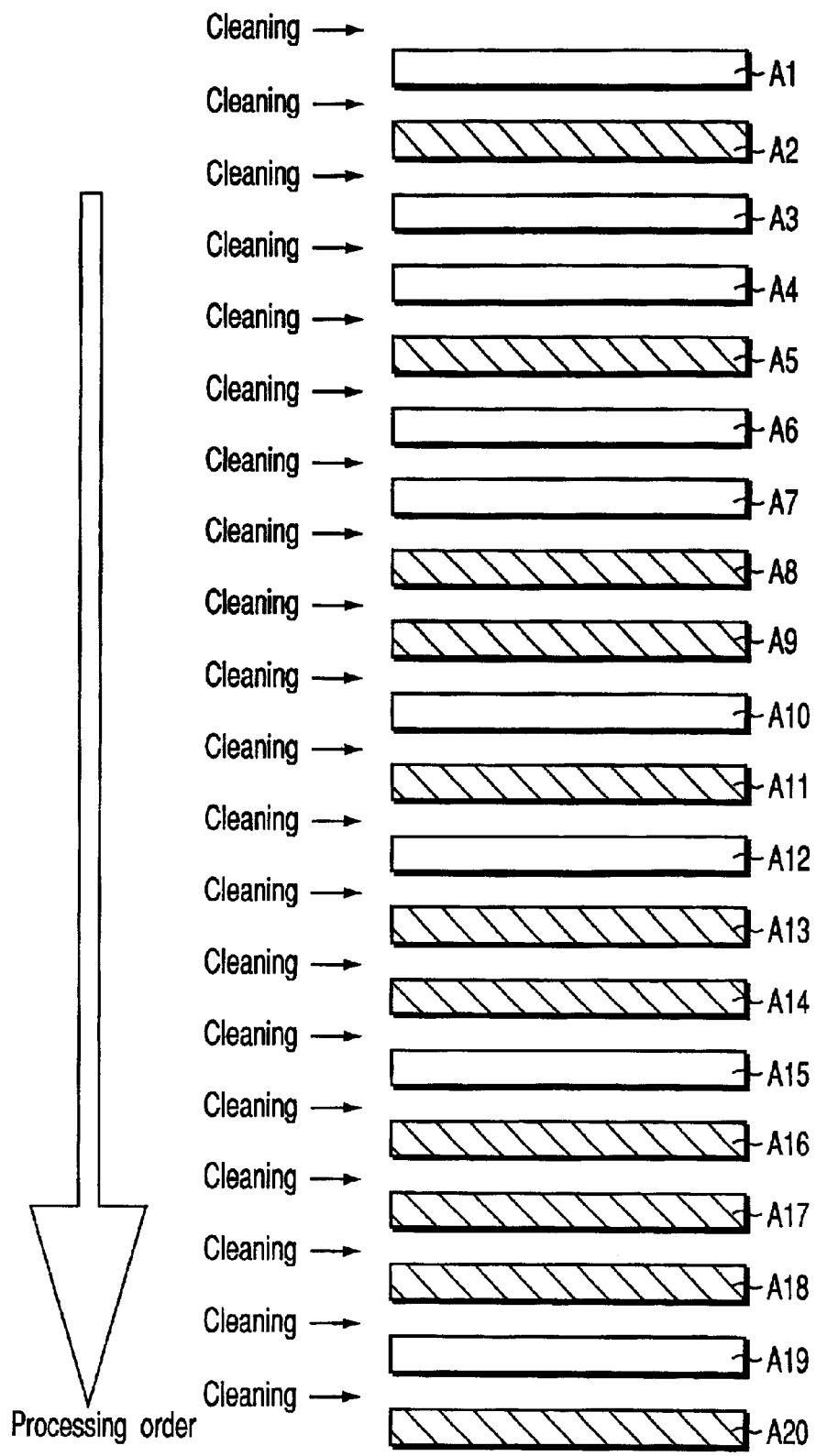
FIG. 3 schematically shows a method of processing a plurality of lots each including Si substrates to be processed by using a conventional RIE apparatus.

It is possible to overcome such an inconvenience noted above by cleaning the vacuum chamber of the RIE apparatus for every time by means of the plasma cleaning such as dry cleaning, seasoning or mixed cleaning of the dry cleaning and seasoning, thereby removing the deposited film formed on the inner wall thereof, after the Si substrate lot has been processed, as shown in FIG. 3.

However, it happens often that a certain Si substrate lot and a next Si substrate lot are the same type of the RIE processing. In this case, it is originally unnecessary to carry out the plasma cleaning, and the cleaning due to the plasma cleaning carried out regularly is rendered useless. In addition, the cleaning of this kind requires a long time to cause the productivity of the semiconductor device to be lowered.

Under the circumstances, in this embodiment of the present invention, a processed record of the Si substrate lot Aj (j=i+1), which is to be next subjected to the processing, is examined until the RIE processing of a certain Si substrate lot Ai (i=1 to 19) is finished, thereby to judge what type of RIE processing to be carried out. For example, the newest processing record of the Si substrate lot Aj is the RIE processing (first RIE processing) for contacts or via holes, and the next processing is the processing for forming wiring grooves (second RIE processing). It is judged whether or not the cleaning by the plasma cleaning is required depending upon the comparison between the RIE processing type of the Si substrate lot Aj and the RIE processing type of the Si substrate lot Ai based on the result of the judgment. Where the RIE processing of the same type is carried out, the cleaning is not performed before the RIE processing of the Si substrate lot Aj. On the contrary, where a different type of the RIE processing is carried out, the cleaning is accomplished before the RIE processing of the Si substrate lot Aj.

Referring to FIG. 1, since the Si substrate lot A1 is first processed by the RIE processing, the cleaning is carried out before the RIE processing of the Si substrate lot A1 regardless of the processing record thereof.

With respect to the Si substrate lot A2, it has been judged from the processing record that the second type RIE processing is carried out. Since the first type RIE processing is now carried out with respect to the Si substrate lot A1, the cleaning is achieved before the RIE processing of the Si substrate lot A2.

Then, it has been judged from the processing record that the first type RIE processing is carried out with respect to the Si substrate lot A3. Since the Si substrate lot A2 is now subjected to the second type processing, the cleaning is accomplished before the RIE processing of the Si substrate lot A3.

Then, it has been judged from the processing record that the Si substrate lot A4 is subjected to the first type RIE processing. Since the Si substrate lot A2 is subjected to the first type processing, the cleaning is not carried out before the RIE processing of the Si substrate lot A4.

In this fashion, the type of the RIE processing is judged on the basis of the processing records of the Si substrate lots A5 to A20 before their RIE processing. Based on the result of the judgment on the type of the RIE processing, it is judged whether or not the cleaning is required before the RIE processing of the next Si substrate lot. The cleaning is not carried out if unnecessary, and the RIE processing of the next Si substrate lot(s) is accomplished in succession.

That is, when it is necessary to carry out the cleaning, the next Si substrate lot is processed in principle after the cleaning. It should be noted, however, that, where there is a special situation, the next Si substrate lot is processed without the cleaning. Then, in the case where the next Si substrate lot is processed, it is judged whether or not the cleaning is necessary for the semiconductor manufacturing apparatus. When the cleaning is not necessary, the next Si substrate lot is processed without the cleaning, thereby decreasing the number of times of cleaning processing. It follows that it is possible to carry out efficiently a series of process steps for processing a plurality of Si substrate lots one by one.

As a result, in the case of the embodiment, it suffices to carry out the cleaning 14 times as shown in FIG. 1. On the other hand, in the case of the prior art shown in FIG. 3, it is necessary to carry out the cleaning 20 times because the cleaning is routinely carried out for every time without making any judgment. In other words, the useless cleaning is carried out 6 times in the prior art.

According to the embodiment, in the manufacturing method of the semiconductor device including a series of steps for applying the RIE processing to a plurality of Si substrate lots one by one by using the RIE apparatus, it is possible to remove efficiently the deposited film consisting of the reaction product formed by the RIE processing of the Si substrate immediately before or the deposited film consisting of the substances formed by the decomposition of the reactive gas used in the RIE processing from the inner wall of the RIE apparatus by the plasma cleaning, thereby improving the manufacturing efficiency of the semiconductor device.

Figure 2:
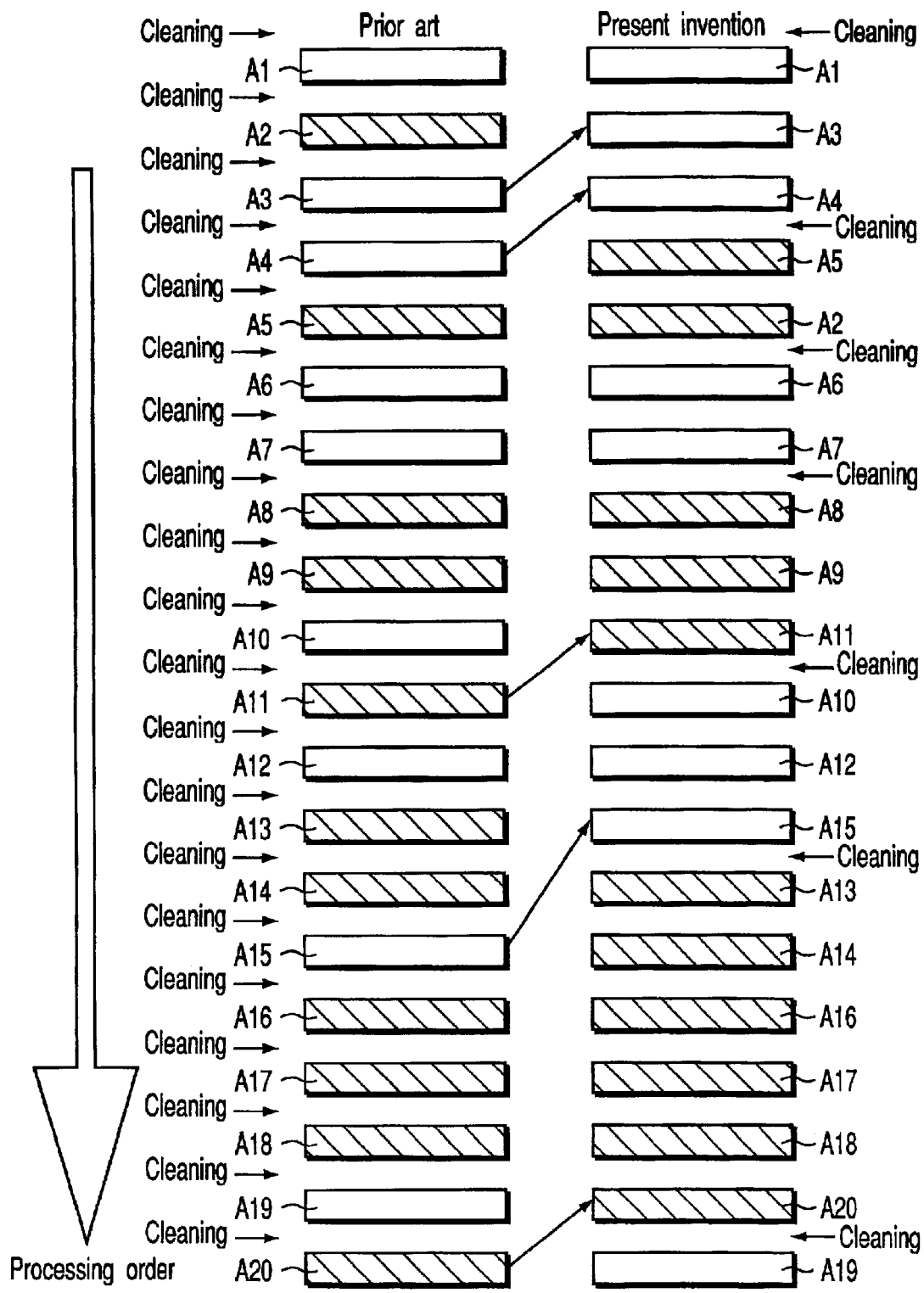
FIG. 2 schematically shows a method of processing a plurality of lots each including Si substrates to be processed by using an RIE apparatus according to a second embodiment of the present invention.

FIG. 2 schematically shows the processing method of a plurality of Si substrate lots by using the RIE apparatus according to the second embodiment of the present invention. Incidentally, those portions of FIG. 2 which correspond to the portions of FIG. 1 are denoted by the reference numerals used in FIG. 1 for avoiding an overlapping description.

The second embodiment is featured in that the order of processing of a plurality of Si substrate lots, which are to be processed after the Si substrate lot now under processing, is changed to decrease the number of times of cleaning treatments. To be more specific, the processing order is changed based on the processing records of the subsequent Si substrate lots such that the RIE processing of the same type is carried out in succession as much as possible.

Referring to FIG. 2, since Si substrate lot A1 is first subjected the RIE processing, the cleaning is carried out before the RIE processing of the lot A1 regardless of the processing record thereof.

Thereafter, it is judged from the processing record that the second type RIE processing is applied to the Si substrate lot A2. Since the first type RIE processing is applied to the Si substrate lot A1 now under processing, different types of the RIE processing are applied to the Si substrate lot A1 and the Si substrate lot A2.

Then, it is judged from the processing record that the first type RIE processing is applied to the Si substrate lot A3. Since the first type RIE processing is applied to the Si substrate lot A1 now under processing, the same type of the RIE processing is applied to the Si substrate lot A1 and the Si substrate lot A3.

Therefore, in the second embodiment, the order of the Si substrate lot A2 and the Si substrate lot A3 is changed during the RIE processing of the Si substrate lot A1 such that the first type RIE processing is carried out twice consecutively.

In the next step, the type of the RIE processing of the next Si substrate lot is judged from the processing record during the RIE processing of the Si substrate lot A3. The judgment noted above can be omitted concerning the Si substrate lot A2 because it was judged in the preceding step that the second type RIE processing would be applied to the Si substrate lot A2. Since the first type RIE processing is being applied to the Si substrate lot A3 now under processing, different types of the RIE processing are applied to the Si substrate lot A3 and the Si substrate lot A2.

It is judged from the processing record that the Si substrate lot A4 is subjected to the first type RIE processing. Since the first type RIE processing is applied to the Si substrate lot A3 now under processing, the same type of the RIE processing is applied to the Si substrate lot A3 and the Si substrate lot A4.

In the second embodiment, the order of the Si substrate lot A2 and the Si substrate lot A4 is changed during the RIE processing of the Si substrate lot A3, thereby permitting the first type RIE processing to be consecutively carried out three times.

In this fashion, the type of the RIE processing each Si substrate lot is judged on the basis of the processing record of the waiting Si substrate lot, and the order of the subsequent Si substrate lots is changed such that the same type of the RIE processing is carried out consecutively. As a result, in the case of the second embodiment, the number of times of the cleaning can be decreased to seven, though it was necessary to carry out the cleaning as much as twenty times in the prior art.

Therefore, according to the second embodiment, for processing remaining Si substrate lots, since one of the remaining Si substrate lots is processed after processing the Si substrate lot which does not require the cleaning of the semiconductor manufacturing apparatus, the number of times of the cleaning can be reduced. It follows that it is possible to carry out efficiently a series of process steps for processing the Si substrate lots one by one, thereby improving the production efficiency of the semiconductor devices in the same manner as the first embodiment.

The present invention is not limited to the embodiments described above. For example, in each the embodiments described above, the Si substrate lots are taken up as the Si substrate lots. However, semiconductor substrate lots such as the SiGe substrate lots and insulating substrate lots such as glass substrate lots may be applied thereto.

Also, each of the embodiments described above covers the case of using the RIE apparatus. However, it will be also possible to use other plasma processing apparatus such as a plasma CVD apparatus. Further, even if plasma is not used, the present invention can be effectively applied to other semiconductor manufacturing apparatus in which it is necessary to apply a predetermined processing such as cleaning during a series of process steps applied to a plurality of substrate lots.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of processing a plurality of lots, each including semiconductor substrates to be processed, for every one lot by using a semiconductor manufacturing apparatus, the method comprising:

extracting at least one lot to be processed without cleaning the semiconductor manufacturing apparatus from a plurality of lots, remaining lots of the plurality of lots being other than a first lot; and processing the extracted at least one lot after the first lot.

2. The method according to claim 1, wherein the extracted at least one lot and the first lot are subjected to the same type of processing.

3. The method according to claim 1, wherein the processing order of the remaining lots is changed based on a history of processing so that the same type of processing is continued.

4. The method according to claim 3, wherein the processing order of the remaining lots is changed so as to reduce the operation times of cleaning of the semiconductor manufacturing apparatus.

5. The method according to claim 1, wherein the semiconductor manufacturing apparatus is previously cleaned in the case where the first lot is cleaned.

6. The method according to claim 1, wherein the cleaning of the semiconductor manufacturing apparatus includes dry-cleaning, seasoning, and a mixed cleaning of dry cleaning and seasoning.

7. The method according to claim 1, wherein the semiconductor manufacturing apparatus is a plasma processing apparatus.

8. The method according to claim 7, wherein the plasma processing apparatus is a plasma etching apparatus.

9. The method according to claim 1, wherein the plurality of lots are subjected to reactive ion etching (RIE).

* * * * *